(12) United States Patent
Preuss et al.

(10) Patent No.: US 10,256,130 B2
(45) Date of Patent: Apr. 9, 2019

(54) ELECTROSTATIC HOLDING DEVICE AND METHOD FOR THE OPERATION THEREOF, AND CHARGE TRANSFER CIRCUIT

(71) Applicant: Berliner Glas KGaA Herbert Kubatz GmbH & Co., Berlin (DE)

(72) Inventors: Peter Preuss, Neu-Zittau (DE); Gunnar Heinze, Luebbenau (DE); Michael Fall, Berlin (DE); Alexander Stein, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 346 days.

(21) Appl. No.: 15/365,365

(22) Filed: Nov. 30, 2016

(65) Prior Publication Data

US 2017/0162414 A1 Jun. 8, 2017

(30) Foreign Application Priority Data

Dec. 4, 2015 (DE) .......................... 10 2015 015 765

(51) Int. Cl.
*H01L 21/683* (2006.01)
(52) U.S. Cl.
CPC ...... *H01L 21/6831* (2013.01); *H01L 21/6833* (2013.01)

(58) Field of Classification Search
CPC .................... H01L 21/6831; H01L 21/6833
See application file for complete search history.

(56) References Cited

FOREIGN PATENT DOCUMENTS

JP 06244270 A 9/1994

OTHER PUBLICATIONS

English language abstract for JP 06244270 A (1994).

*Primary Examiner* — Zeev V Kitov
(74) *Attorney, Agent, or Firm* — Caesar Rivise, PC (57) ABSTRACT

An electrostatic holding device (100) for holding component (1) by electrostatic holding forces includes clamp carrier (10) which has electrode device (11) and is configured for receiving component (1), voltage source device (20) for provision of a source charge current for charging clamp carrier (10), source switching device (30) which is arranged for a switchable connection of voltage source device (20) with electrode device (11), and at least one charge storage device (40, 40A, 40B) which has storage capacitor (41, 41A, 41B) and is configured to receive a clamp discharge current and temporarily store electrical charges of clamp carrier (10) in storage capacitor (41, 41A, 41B) and provide a storage charge current for charging clamp carrier (10). Also described is a method for operating holding device (100) and transfer circuit (200) for transmitting charges from working capacitor (201) to storage capacitor (202).

15 Claims, 6 Drawing Sheets

ELECTROSTATIC HOLDING DEVICE AND METHOD FOR THE OPERATION THEREOF, AND CHARGE TRANSFER CIRCUIT

The invention relates to an electrostatic holding device which is configured to hold a component, such as for example a semiconductor wafer, by electrostatic holding forces. Furthermore, the invention concerns a method for operation of the electrostatic holding device. Furthermore, the invention relates to a transfer circuit which is configured to transfer electrical charges from a working capacitance, such as for example a clamp carrier of an electrostatic holding device, to a storage capacitance, and a method for operating the transfer circuit. Applications of the invention are available in particular in the manufacturing of electrostatic holding devices and their operation.

Holding devices for electrostatic holding of components, also called electrostatic holding devices, electrostatic clamping devices, electrostatic clamps, electrostatic chucks or ESCs, are generally known. An important application of electrostatic holding devices lies in the holding of semiconductor wafers, in particular silicon wafers, in lithographic semiconductor processing, for example in chip production. As particular advantages, the ease of switching of electrostatic holding forces, a high positioning accuracy and a reliable fixing of the components in the vacuum are utilized.

An electrostatic holding device has a clamp carrier with at least one exposed surface to receive the component, and an electrode device integrated in the clamp carrier. The electrostatic holding forces are produced in that a high voltage is applied to the electrode device and the clamp carrier is correspondingly electrically charged. The charged clamp carrier attracts the component so that this adheres to the exposed surface of the clamp carrier and can be held and/or moved therewith. To release the component, the clamp carrier is discharged and optionally recharged, i.e. charged with reversed polarity (so-called "declamping").

Conventional electrostatic holding devices have proved disadvantageous in practical use for the following reasons. Previously, the clamp carrier was discharged by connecting the electrode device to earth potential (grounding). The energy stored in the charged clamp carrier, because of the low capacitance value of the clamp carrier in the range of a few nF, is relatively low. However, when all discharge processes on all holding devices in a semiconductor processing installation are cumulated, the discharge can result in a substantial energy loss.

Furthermore, declamping and/or a subsequent work process of the holding device require recharging of the clamp carrier. In order to minimize the duration of the charging process, charging has previously been carried out with as high a current intensity as possible. In order to guarantee the loading of the electrode device with the high voltage and a sufficiently high current intensity, voltage sources with a power of e.g. 5 W are required. Such voltage sources, because of their size and mass, are arranged outside the vacuum chamber provided for the semiconductor processing and connected to the electrode device in the clamp carrier via electric lines. The line connections however, because of the use of high voltage, require special measures for reliable electrical isolation and to avoid undesirable arcing when operated in a high vacuum. Furthermore, the lines restrict the mobility of the clamp carrier.

So far, no solution to the above problems has been found since the use of smaller dimensioned voltage sources requires changing to lower current intensities when charging the clamp carrier, and hence would lead to long charging times and an excessive delay in the semiconductor processing.

It is the objective of the invention to provide an improved electrostatic holding device with which disadvantages of conventional electrostatic holding devices are avoided. The electrostatic holding device is to be distinguished in particular by a reduced energy consumption, lower requirements for the power of the voltage source, lower requirements for the vacuum on operation of the holding device, and/or increased flexibility in the setting and movement of the holding device. A further objective of the invention is to provide an improved method for operating an electrostatic holding device with which disadvantages of conventional techniques are avoided. The method in particular is to allow charging processes with a reduced charging current, a shorter duration of the charging process, and/or the use of a voltage source with a reduced power.

These objectives are achieved by an electrostatic holding device, a method for its operation, and/or a transfer circuit for the transfer of electrical charges, with the features of the independent claims. Advantageous embodiments and applications of the invention result from the dependent claims.

According to a first general aspect of the invention, the above objective is achieved by an electrostatic holding device which is configured for holding a component by electrostatic holding forces, and comprises a clamp carrier with an electrode device, a voltage source device and a source switching device for switchable connection of the voltage source device to the electrode device. The electrode device is configured for an electrical charging of the clamp carrier when loaded with a high voltage and a source charge current which are supplied by the voltage source device. To provide the high voltage, the voltage source device contains an inductive or capacitive, direct current voltage converter. The clamp carrier constitutes a working capacitance with which, in charged state, the electrostatic holding forces are generated. According to the invention, the electrostatic holding device is provided with at least one charge storage device which has at least one storage capacitance. The at least one charge storage device is configured to receive a clamp discharge current and temporarily store electrical charges from the clamp carrier in the storage capacitance and provide a storage charge current for charging the clamp carrier. By deviation from conventional electrostatic holding devices, the clamp discharge current is not completely diverted to a ground contact but received by the storage capacitance.

One single charge storage device may be provided with one single storage capacitance or a plurality of storage capacitances, which has advantages for the compactness of the circuit. Alternatively, two charge storage devices may be provided which are arranged for receiving the clamp discharge current with different current directions, or for temporary storage of charges from the clamp carrier with different polarization directions, which has advantages for the efficiency of the temporary storage of charges. Furthermore, more than two charge storage devices may be provided in order to store charges in different operating phases of the electrostatic holding device. Preferably, each charge storage device contains at least one storage capacitance for temporary storage of electrical charges from the clamp carrier.

Advantageously, the at least one charge storage device offers a number of advantages with which the restrictions of conventional techniques are avoided or even excluded completely. Firstly, the clamp discharge current is not completely lost. The clamp discharge current, apart from Ohmic losses, can be received completely by the at least one storage capacitance. The energy consumption of the electrostatic holding device is reduced. Secondly, by providing the storage charge current, the load on the voltage source device is reduced. This allows the voltage source device to be configured with an output power which is reduced in comparison with conventional techniques. The voltage source device may be provided with a compact construction, avoiding the restrictions of conventional holding devices in relation to the arrangement and operation of the voltage source device.

According to a second general aspect of the invention, the above objective is achieved by a method for operating an electrostatic holding device which is configured for holding a component by electrostatic forces, and which has a clamp carrier, wherein the clamp carrier is charged with a first polarization direction and used in a clamp state to hold and/or move the component, and wherein then the clamp carrier is discharged using at least one charge storage device with a storage capacitance, and recharged with a second opposite polarization direction in order to release the component in a declamp state. Advantageously, by the temporary storage of electrical charges in the at least one charge storage device, an energy loss is reduced and the setting of the declamp or a further clamp state is accelerated.

According to a preferred embodiment of the invention, the at least one charge storage device is provided with a transfer switching device. The transfer switching device is configured for a switchable connection of the electrode device to the storage capacitance, so that in an ON state of the transfer switching device, the clamp discharge current can flow from the electrode device to the storage capacitance, and in an OFF state, the electrode device is electrically isolated from the storage capacitance. Furthermore, the electrostatic holding device is provided with a changeover switching device for switchable connection of the electrode device to the storage capacitance. The changeover switching device, in addition to the at least one transfer switching device, is arranged for switchable connection of the electrode device to the storage capacitance, such that the storage charge current can flow from the storage capacitance to the electrode device with settable current direction. The changeover switching device is preferably configured such that the storage charge current flows from the storage capacitance to the electrode device with a first current direction in a first ON state and in a second opposite current direction in a second ON state. Optionally, the changeover switching device may also have an OFF state in which the electrode device and the storage capacitance are electrically isolated from each other.

Preferably, the transfer switching device(s) and the changeover switching device are configured such that the clamp carrier, in a charged state with a first polarization direction, can be subjected to discharge and subsequent recharge into a charged state with a second opposite polarization direction. For this, the changeover switching device is arranged for connection of the storage capacitance to the electrode device with settable polarity or current direction of the storage charge current.

According to a further preferred embodiment of the invention, the changeover switching device may additionally be arranged for switchable connection of the voltage source device to the electrode device. Particularly preferably, in this case the changeover switching device is configured such that, at the same time as supplying the storage charge current, the source charge current can flow with selectable current direction from the voltage source device to the electrode device. Advantageously, in this way the changeover switching device has a double function, which has a favorable effect on the compactness of the electrical components of the electrostatic holding device.

Advantageously, various configurations of the at least one charge storage device are available which may be selected depending on the actual application conditions of the electrostatic holding device, and in particular depending on the requirements for output power of the voltage source device.

According to a first variant (first embodiment of the invention), the electrode device is connected to the storage capacitance directly via the transfer switching device and the changeover switching device. Only the internal resistances of the transfer switching device and changeover switching device influence the clamp discharge current or storage charge current between the electrode device and the storage capacitance. For discharge, the clamp discharge current flows from the electrode device to the storage capacitance via the transfer switching device and the changeover switching device. For another charging of the clamp carrier with opposite polarity (recharging), the storage charge current flows from the storage capacitance to the electrode device via the changeover switching device and the transfer switching device. The changeover switching device is formed as a changeover switch, so that the clamp discharge current and the storage charge current flow with the equal current directions relative to the electrode device, whereby on recharging, the polarization of the clamp carrier is reversed.

Preferably, in the first embodiment of the invention, the storage capacitance has a total capacitance which is equal to 3 times the capacitance of the clamp carrier. Advantageously, in this case the electrical energy temporarily stored by the storage capacitance can be maximized.

Particularly preferably, in the first embodiment of the invention, the storage capacitance comprises one single storage capacitance, whereby the structure of the charge storage device is advantageously simplified.

According to a second variant (second embodiment of the invention), two charge storage devices are provided each with a transfer switching device and a storage capacitance. The charge storage devices are each arranged to receive the clamp discharge current from opposingly charged sides of the capacitor of the clamp carrier. Each of the charge storage devices contains a transfer circuit, each with a storage inductor and a cycle switching device. The electrode device is connected via one of the transfer switching devices and one of the transfer circuits respectively to one of the storage capacitances, so that the clamp discharge current can flow to the storage capacitances via the transfer circuits. The cycle switching devices are arranged for alternately charging the storage inductors from the electrode device and discharging the storage inductors into the storage capacitances.

The second embodiment of the invention has the particular advantage that the yield with the relocation of charges from the electrode device into the charge storage device may be substantially increased in comparison with the first embodiment of the invention. Apart from Ohmic losses, the electrical charge from the electrode device can be transferred completely to the storage capacitances via the stepwise charging and discharging of the storage inductors. Advantageously, this substantially reduces the load on the voltage source device. The output power of the voltage source device need be dimensioned merely to compensate for Ohmic losses in the charge storage device on operation of the electrostatic holding device.

According to the third general aspect, a transfer circuit which is configured to transfer charges from a working capacitance, in particular the capacitance of the clamp carrier, into a storage capacitance, in particular a storage capacitance of the charge storage device, and/or a method for operation of the transfer circuit, constitute further solutions to the above-mentioned task. The transfer circuit is distinguished in general by a transfer switch, a storage inductor, a cycle switch, a semiconductor valve and a cycle control circuit, wherein the working capacitance, the transfer switch, the storage inductor, the semiconductor valve and the storage capacitance are connected in series, and the cycle switch is connected in parallel to the semiconductor valve and the storage capacitance. The cycle control circuit is arranged for switching the cycle switch alternately ON and OFF, such that in a first switch phase (ON), charges are transferred from the working capacitance into the storage inductor, and in a second switch phase (OFF), charges are transferred from the storage inductor into the storage capacitance. Preferably, the transfer and cycle switches and the semiconductor valve are semiconductor components, in particular transistors and a semiconductor diode, resp.

A particular advantage of the invention lies in the possibility of dimensioning the voltage source device smaller in both electrical and geometric terms than with conventional techniques. Advantageously, this allows the voltage source device and the source switching device to be fixedly connected to the clamp carrier. Advantageously, the high voltage for charging the clamp carrier may be generated thereon, while the voltage source device is supplied via an accumulator device also arranged on the clamp carrier or via supply lines at low potential. Advantageously, this reduces the risk of arcing in the vacuum chamber and lowers the requirements for the vacuum in the vacuum chamber.

Alternatively, the at least one charge storage device and the changeover switching device may be fixedly connected to the clamp carrier and be movable therewith. Particularly preferably, both the voltage source device and the source switching device, and the at least one charge storage device and the changeover switching device, are fixedly connected to the clamp carrier, in particular integrated in the structure of the clamp carrier. Said components can be moved with the clamp carrier on operation of the holding device.

Further details and advantages of the invention are described below with reference to the enclosed drawings. These show in.

Features of preferred embodiments of the invention are described below with reference to the electrical configuration of an electrostatic holding device. Details of the electrostatic holding device, in particular the mechanical and geometric structure of the clamp carrier and the embedding of the electrode device in the clamp carrier, and of its operation, in particular the receiving, moving and depositing of components, in particular semiconductor wafers, are not described since these are known as such from the prior art. The clamp carrier may in particular have plane receiving surfaces on one or both sides, each of which is configured to receive a component.

The electrical configuration of the electrostatic holding device is described with reference to two exemplary circuit diagrams in FIGS. 2 and 8, which illustrate the first and second embodiments of the invention, respectively. It is emphasized that implementation of the invention in practice is not restricted to the circuits shown as examples, but is possible with differently constructed circuits which are designed for discharging/temporary storage of charges from the clamp carrier and for recharging the clamp carrier.

Figure 1:
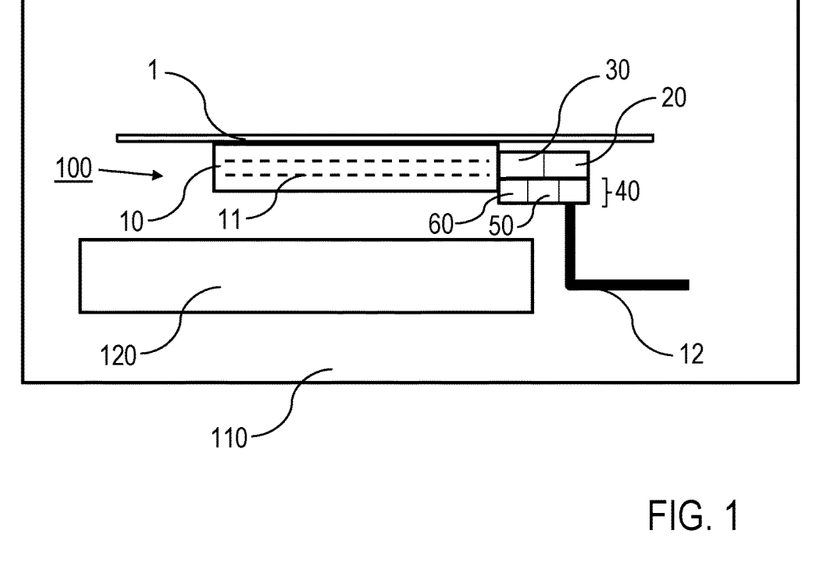
FIG. 1: a diagrammatic depiction of an embodiment of an electrostatic holding device according to the invention.

FIG. 1 shows diagrammatically and not to scale an electrostatic holding device 100 according to the invention in an installation for semiconductor processing, with a vacuum chamber 110 and a processing station 120, for example for exposing or structuring a semiconductor wafer 1. The electrostatic holding device 100 comprises a clamp carrier 10 with an integrated electrode device 11. The clamp carrier 10 is for example constructed in the manner known from conventional electrostatic holding devices, and configured for receiving the semiconductor wafer 1. A voltage source device 20 with a source switching device 30, and at least one charge storage device 40 with the transfer and changeover switching devices 50, 60, are fixedly connected to the clamp carrier 10. The clamp carrier 10 is adjustable relative to the processing station 120 by means of a holding arm 12 and a drive device (not shown), and is movable or can be traversed to a further processing station.

The voltage source device 20 is connected to an external power supply via connecting lines (not shown). The connecting lines are coupled to the holding arm 12. The power supply to the voltage source device 20 is set to a low voltage potential, for example in the range from 1.2 V to 48 V. The high voltage at the electrode device 11 is created with a direct current voltage converter (not shown) of the voltage source device 20. Alternatively, the voltage source device 20 may, instead of the connection to an external power supply, be provided with an accumulator device (not shown).

Figure 2:
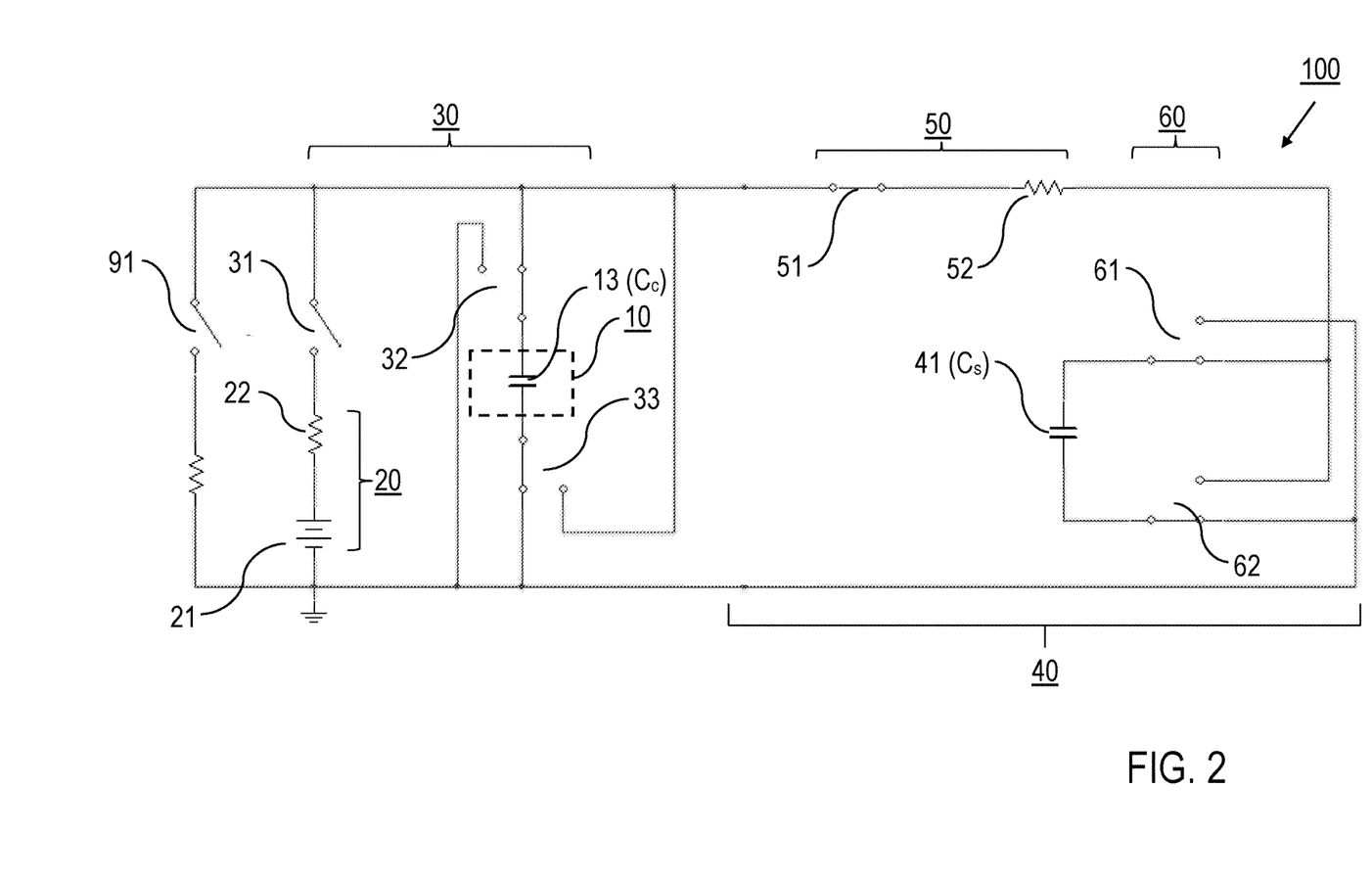
FIG. 2: a circuit diagram of the electrostatic holding device according to the first embodiment of the invention.

FIG. 2 shows a circuit diagram of the electrostatic holding device 100 according to the first embodiment of the invention. The clamp carrier 10 and the electrode device 11 according to FIG. 1 are represented by the clamp capacitor 13 ($C_{c1}$). The voltage source device 20 comprises a DC voltage source 21, the internal resistance of which is designated with reference numeral 22, with a DC voltage converter (not shown). The DC voltage converter is a standard component with which an input voltage at low voltage level is converted to the desired high voltage. The voltage source device 20 is connected to the clamp capacitor 13 via the source switching device 30, comprising a main switch 31 and two source changeover switches 32, 33. The DC voltage source 21 with the internal resistance 22, the main switch 31, the first source changeover switch 32, the clamp capacitor 13 and the second source changeover switch 33, are connected in series. Depending on the position of the switching device 30, in particular the source changeover switches 32, 33, the polarization direction of the clamp capacitor 13 can be set. The first and second source changeover switches 32, 33 are controlled such that one side of the clamp capacitor 13 is connected either to the positive or to the negative pole, and the other side of the clamp capacitor 13 is connected accordingly either to the negative or to the positive pole of the DC voltage source 21.

Furthermore, the clamp capacitor 13 is connected to the charge storage device 40 which comprises the storage capacitance 41 ($C_s$), the transfer switching device 50 with a single transfer switch 51, the internal resistance of which is designated with the reference numeral 52, and the changeover switching device 60 with the transfer changeover switches 61, 62. The charge storage device 40 forms a series circuit of the clamp capacitor 41 with the transfer switch 51, the first transfer changeover switch 61, the storage capacitance 41 and the second transfer changeover switch 62. The transfer changeover switches 61, 62 are activated such that the first side of the storage capacitance 41 (as shown) is connected either to the first side of the clamp capacitor 13 or to the second side of the clamp capacitor 13.

With a clamp capacitor 13 of e.g. 3 nF and a clamp voltage of e.g. 3 kV, the internal resistance 52 amounts e.g. to 10Ω, and the storage capacitance 41 is e.g. 10 nF. The DC voltage source 21 is designed for an output voltage of e.g. 3 kV, whereas the internal resistance 22 amounts e.g. to 10Ω.

In addition, FIG. 2 shows a discharge switch 91 which is arranged for discharging the clamp capacitor 13 and optionally also the storage capacitance 41. When the main switch 31 is opened, the transfer switch 51 is closed and the discharge switch 91 is closed, the two capacitors 13, 41 are connected to earth potential (grounding). Discharging may be advantageous for example for creating a defined starting state on operation of the electrostatic holding device or on termination thereof.

Figure 3:
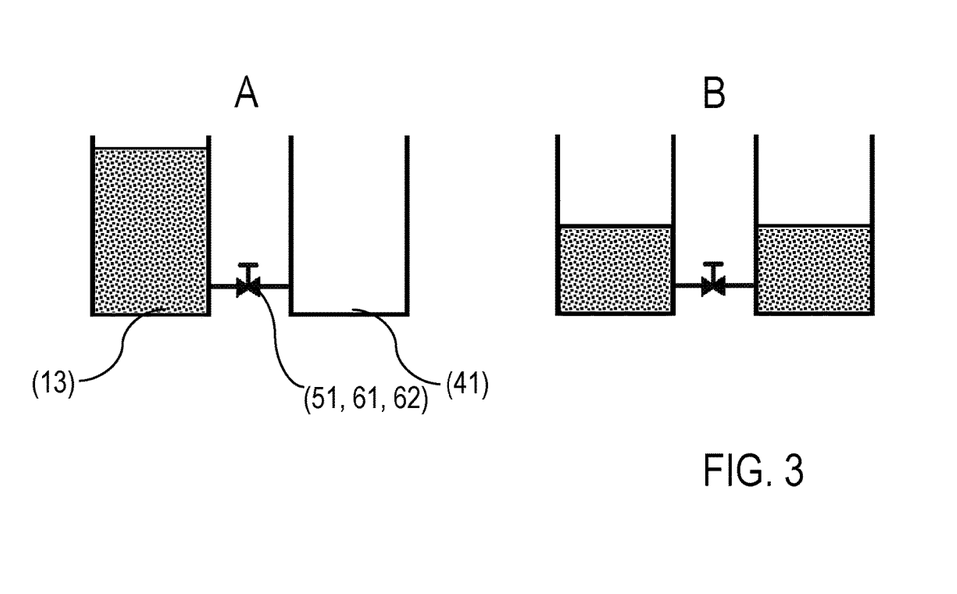
FIG. 3: an illustration of the first embodiment using a vessel model.

The function of the charge storage device of the first embodiment in FIG. 2 is illustrated in FIG. 3 with a vessel model, wherein, instead of the clamp and storage capacitances 13 and 41, vessels filled with fluid are depicted which are connected via a valve. The function of the valve is fulfilled by the transfer switch 51 and the transfer changeover switches 61, 62.

Before the transfer of charges, according to FIG. 3A the vessel corresponding to the clamp capacitor 13 is filled, wherein the fill level in the vessel corresponds to the voltage at the clamp capacitor 13, the width of the vessel corresponds to the capacitance value of the clamp capacitor 13, the cross-section area corresponds to the stored charge, and the volume of the vessel corresponds to the stored electrical energy. When the valve between the two vessels is opened, the image shown in FIG. 3B results. In the case of equal capacitance values of the clamp and storage capacitances 13, 41, half the original charge present in the clamp capacitor 13 flows to the storage capacitance 41. At the same time, only 25% of the electrical energy is received by the storage capacitance 41. The remaining energy is converted into the charge displacement work.

When according to FIG. 2 the charges stored in the storage capacitance 41 are to be used for recharging the clamp capacitor 13, first the clamp capacitor 13 is discharged using the discharge switch 91. Then the polarity of the changeover switching device 60 is reversed by activating the transfer changeover switches 61, 62, and the transfer switch 51 of the switching device 50 is closed. According to the vessel model in FIG. 3, the charges temporarily stored flow back to the clamp capacitor 13 now.

In the first embodiment according to FIG. 2, on temporary storage in the storage capacitance 41, only part of the charges of the clamp carrier 10 are received, as shown in FIG. 3. The charges remaining on the clamp carrier 10 are diverted before recharging (declamping), by grounding the clamp carrier 10 via the discharge switch 91. Although this is associated with an energy loss, the first embodiment still provides a load reduction on the voltage source device.

Figure 4:
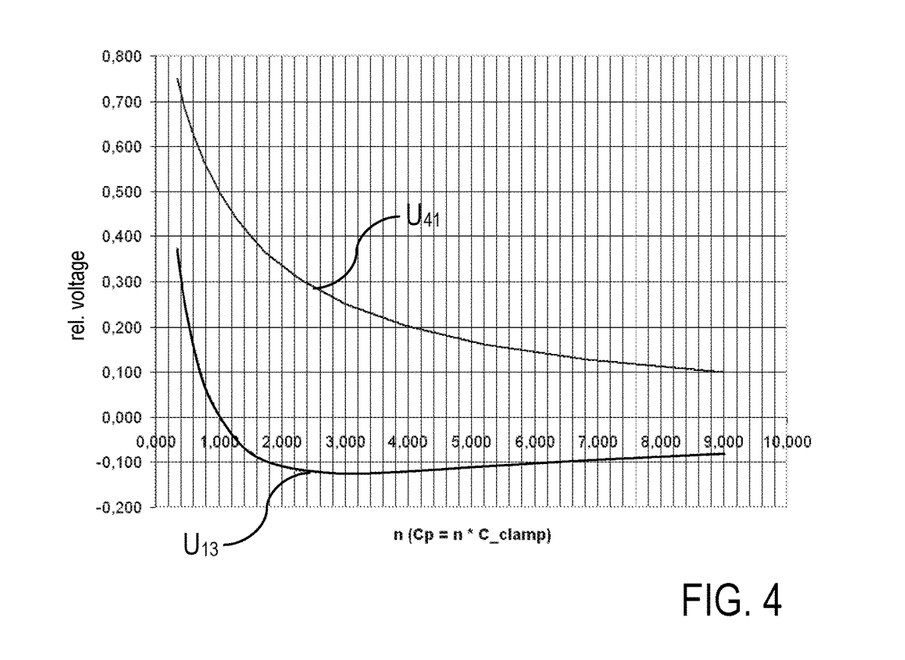
FIG. 4: a graph of electrical parameters of the charge storage device according to FIG. 2.

FIG. 4 shows the dependence of the voltage $U_{41}$ of the storage capacitance 41 and the voltage $U_{13}$ of the clamp capacitor 13 on the quotient n of the capacitance values of the storage capacitance 13 and the clamp capacitor 41 ($n=C_s/C_c$). The inventor has found that the maximum efficiency of the back transfer of the charge is achieved for n=3. If the storage capacitance 41 is equal to 3 times the value of the clamp capacitor 13, the maximum load relief of the voltage source device 20 is achieved on recharging of the clamp capacitor 13 with the arrangement shown in FIG. 3 in a subsequent charging process.

The method for operating the electrostatic holding device 100 (ESC) according to FIG. 2 is described below with reference to FIG. 5. In a first step S1, the electrostatic holding device 100 is electrically charged. The main switch 31 is switched ON and the source changeover switches 32, 33 are set such that the electrode device 11 of the clamp carrier 10 is loaded with a high voltage from the DC voltage source 21, a charge current flows to the electrode device 11 and the clamp capacitor 13 is charged.

The charged clamp capacitor 13 is then in the clamp state in which a component is received and handled (ESC work process, step S2). In the clamp state, the main switch 31 is switched OFF. On completion of processing of the component, this is e.g. deposited or transferred to an adjacent processing station. To this end, the clamp carrier 10 is then discharged (step S3) and recharged (declamp process, step S4).

Step S3 comprises the discharging of the clamp capacitor 13 according to the invention, wherein the transfer switch 51 is switched ON and the transfer changeover switches 62, 63 are set such that a clamp discharge current flows to the storage capacitance 41 with a specific current direction, the clamp capacitor 13 is discharged and the electrical charges from the clamp capacitor 13 are temporarily stored in the storage capacitance 41. In the first embodiment, the clamp capacitor 13 is not fully discharged by the connection with the storage capacitance 41 (see FIG. 3). For this reason, step S3 is terminated with a residual discharge of the clamp capacitor 13, wherein the transfer switch 51 is switched OFF and the discharge switch 91 is switched briefly ON.

In step S4, the clamp carrier 10 is recharged with a polarization direction which is opposite in relation to the previous clamp state. The transfer switch 51 is switched ON, wherein charges flow from the storage capacitance 41 to the clamp carrier 10. The transfer changeover switches 61, 62 and the source changeover switches 32, 33 are set such that the opposite polarization direction results at the clamp capacitor 13 and the component is released from the electrostatic holding device 100.

Finally, in step S5, it is checked whether a further ESC work process is provided. If e.g. a further component is to be received, a further complete charging of the clamp carrier 10 (step S1) and the further step sequences described are performed. Since the clamp carrier 10 is still partially charged from step S4, step S1 only requires a top-up charge. If no further component is to be received, the process is ended.

An almost complete transfer of charges from the clamp carrier and hence an improved energy-saving is achieved with the second embodiment of the electrostatic holding device according to the invention. Here, the charges are transferred from the clamp carrier to the storage capacitance by means of a transfer circuit which constitutes an independent subject of the invention and is explained below with reference to FIGS. 6 and 7.

Figure 6:
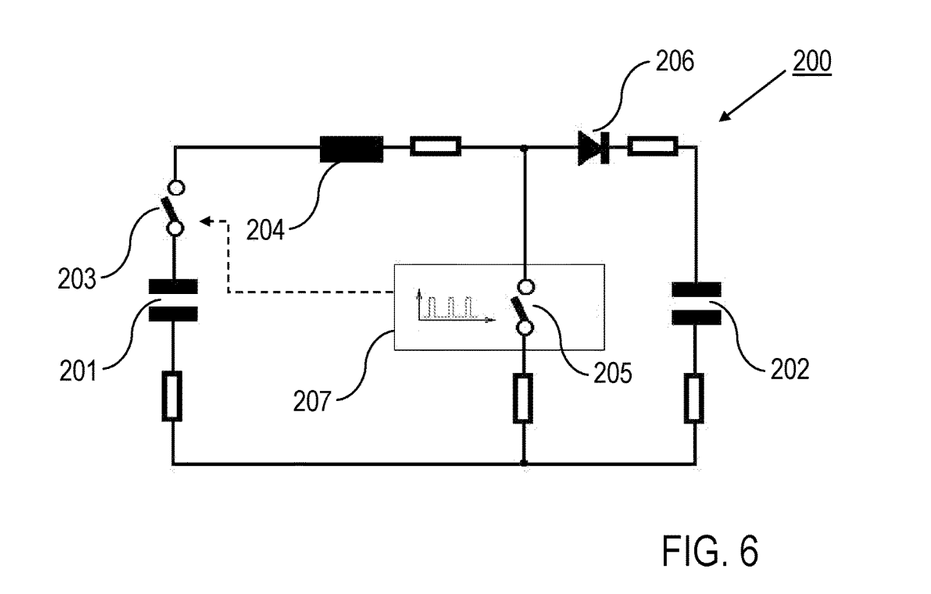
FIG. 6: an electrical circuit diagram of a transfer circuit according to the invention.
Figure 7:
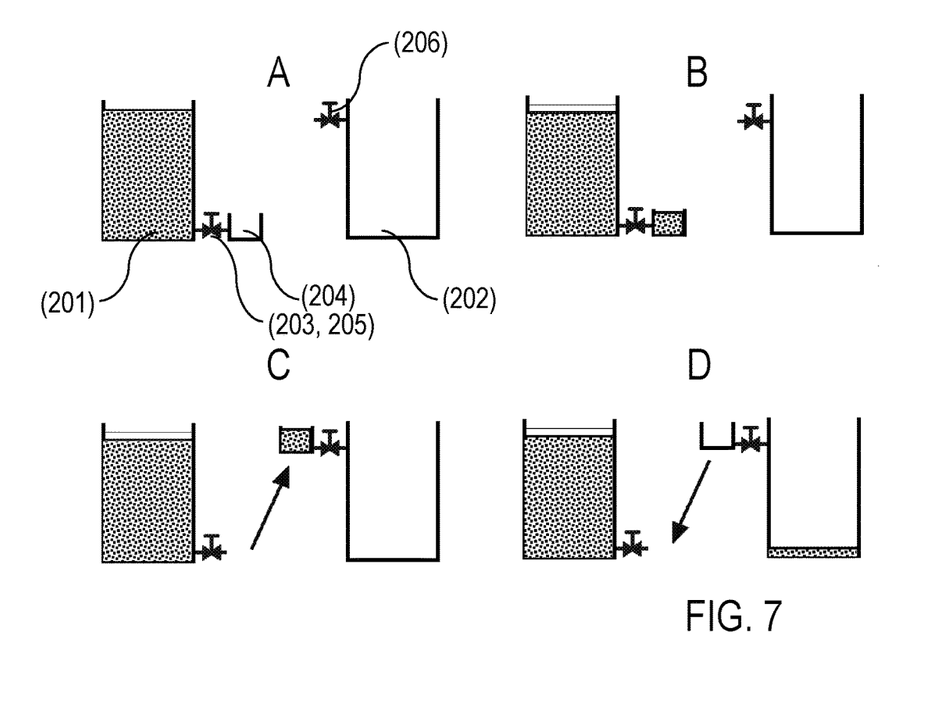
FIG. 7: an illustration of the transfer circuit according to FIG. 6 using a vessel model.

According to FIG. 6, the transfer circuit 200 generally comprises a working capacitance 201 and a storage capacitance 202, which is arranged for storing charges from the working capacitance 201. Furthermore, the transfer circuit 200 comprises a transfer switch 203, a storage inductor 204, a cycle switch 205, a semiconductor valve 206, and a cycle control circuit 207. Furthermore, FIG. 6 depicts with a resistance symbol the internal resistances of the working capacitance 201, the storage inductor 204, the semiconductor valve 206, the second cycle switch 205, and the storage capacitance 202. In the circuit diagram of the second embodiment of the holding device according to the invention shown in FIG. 8, the working capacitance 201 corresponds to the clamp capacitor 13, the storage capacitance 202 corresponds to one of the storage capacitances 41A, 41B, the transfer switch 203 corresponds to one of the transfer switches 51A, 51B of the transfer switching devices 50A, 50B, the storage inductor 204 corresponds to one of the storage inductors 43A, 43B, the second cycle switch 205 corresponds to one of the cycle switches 71A, 71B of the changeover switching device 70A, 70B, the semiconductor valve 206 corresponds to one of the semiconductor diodes 44A, 44B, and the cycle control circuit 207 corresponds to the control device 80.

The working capacitance 201, the transfer switch 203, the storage inductor 204, the semiconductor valve 206 and the storage capacitance 202 are connected in series. The cycle switch 205 is connected in parallel to the semiconductor valve 206 and the storage capacitance 202. The transfer and cycle switches 203, 205 are formed by switch transistors, e.g. type IXTH02N450HV, which can be switched ON and OFF by pulse-like cyclic signals (driver signals) of the cycle control circuit 207. When used in the electrostatic holding device 100 according to FIG. 9, the storage inductor 204 has an inductance value of e.g. 1 mH.

The electrical charges are returned from the working capacitance 201 to the storage capacitance 202 by a stepped transfer of charges, in a first part step from the working capacitance 201 into the storage inductor 204, and in a second part step from the storage inductor 204 into the storage capacitance 202. The part steps are explained below with reference to the vessel model in FIG. 7. In the vessel model, the large vessels represent the working capacitance 201 and the storage capacitance 202, while the small vessel represents the storage capacity of the storage inductor 204. The lower valve corresponds to the transfer and cycle switches 203, 205 while the upper valve represents the semiconductor valve 206.

FIG. 7A shows the starting situation before the charge transfer, wherein all charges are present in the working capacitance 201.

In a first part step according to FIG. 7B, the small vessel is filled from the first vessel, which corresponds to a transfer of part of the charges from the working capacitance 201 into the storage inductor 204. For this, the lower valve connected to the first vessel is opened (transfer and cycle switches 203, 205 switched ON). From the working capacitance 201, a current flows into the storage inductor 204 until this is magnetically saturated. A magnetic field thus builds up in which the electrical energy of the transferred part charge is stored.

Then according to FIG. 7C, the small vessel is isolated from the first vessel and transferred into a higher energy state. The storage inductor 204 is isolated from the working capacitance 201 (transfer and cycle switches 203, 205 switched OFF). The transfer to the higher energy state takes place using mutual induction. The mutual induction voltage is sufficiently high such that the semiconductor valve 206 opens in the passage direction. In the vessel model, in the second part step the upper valve is opened which is connected to the second vessel. Then the charges flow from the storage inductor 204 through the semiconductor valve 206 into the storage capacitance 202.

Finally, after the charges have been reduced in the storage inductor 204, according to FIG. 7D the upper valve is switched back into the closed state (semiconductor valve 206 in the blocking direction) and the storage inductor 204 is transferred back into the lower energy state (FIG. 7A). Then a further part charge can be taken from the storage inductor 204 and transferred into the storage capacitance 202.

Because of the blocking function of the semiconductor valve 206, the charges cannot flow back from the storage capacitance 202 into the working capacitance 201, so that all charges step-wise are transferred from the working capacitance 201 into the storage capacitance 202. Losses are caused only by the internal resistances of the individual components. Since however the transfer circuit 200 in the electrostatic holding device is operated at high voltage and relatively small currents flow, the Ohmic losses in the transfer circuit are also relatively low. An approximation of a real application of a transfer circuit 200 has shown that at least 80% of the electrical energy from the working capacitance 201 can be stored in the storage capacitance 202. To discharge the working capacitance 201 and charge the working capacitance 202, for example 200 switching cycles are required each with a duration of microseconds, so that a complete temporary storage advantageously only has a duration of a few milliseconds.

Figure 8:
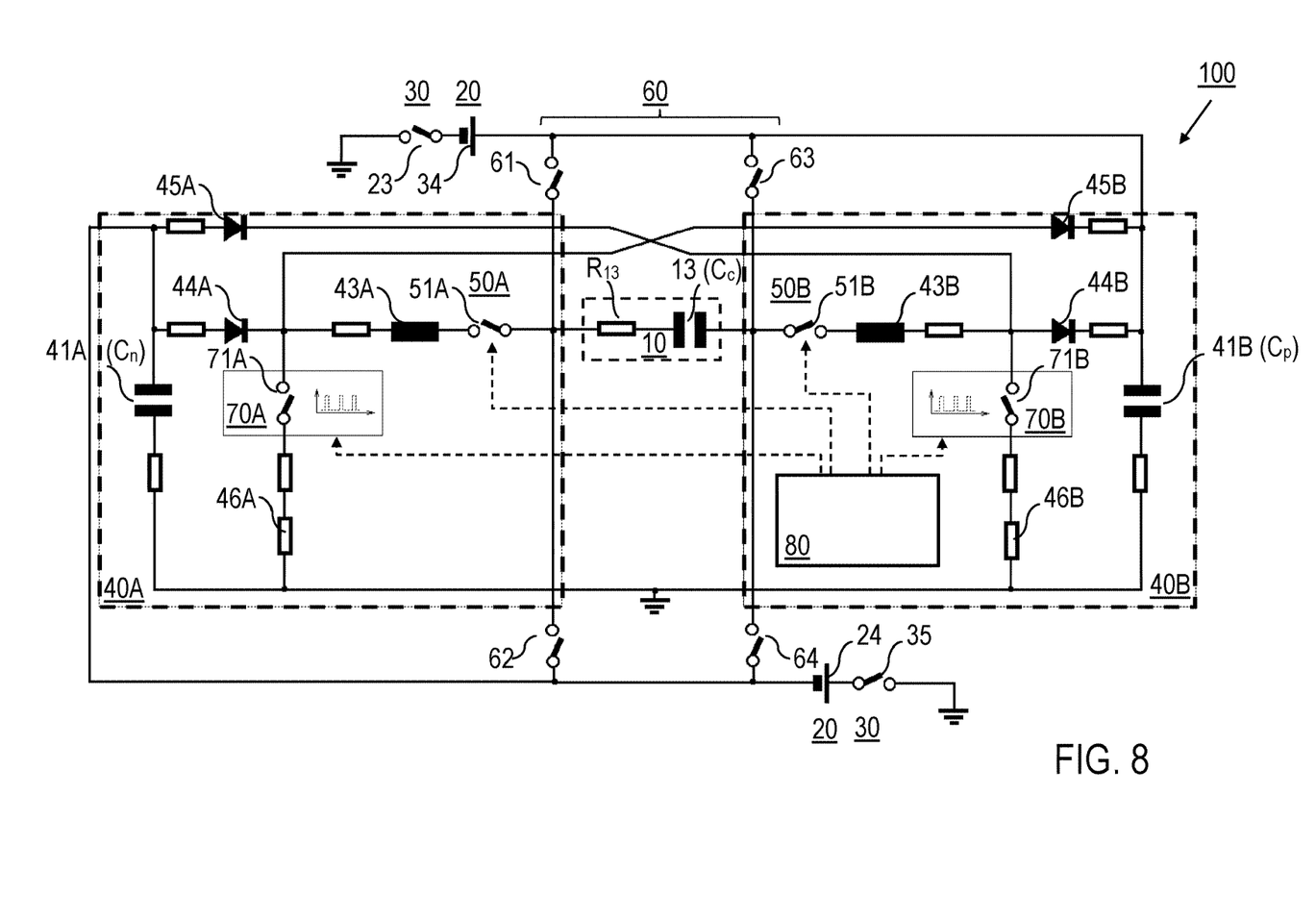
FIG. 8: a circuit diagram of the electrostatic holding device according to the second embodiment of the invention, with two transfer circuits according to FIG. 6.

The preferred application of the transfer circuit according to FIG. 6 lies in the second embodiment of the electrostatic holding device 100, the circuit diagram of which is shown in FIG. 8. The clamp carrier 10 of the electrostatic holding device 100 is depicted by the clamp capacitor 13 ($C_c$) and its internal resistance $R_{13}$. Two charge transfer devices 40A, 40B, each with a transfer circuit and a storage capacitance 41A, 41B, are connected to the clamp capacitor 13 as shown in FIG. 6, and are each configured symmetrically relative to the clamp capacitor 13 for opposing current directions and polarities.

The electrostatic holding device 100 according to FIG. 8 has a voltage source device 20 with two DC voltage sources 23, 24, each with a DC voltage converter (not shown). The voltage source device 20 is connected to the clamp capacitor 13 via changeover switches 61, 62, 63 and 64 of the changeover switching device 60. The changeover switches 61, 62, 63 and 64 serve to select the current direction of the source charge current from the DC voltage sources 23, 24, and of the storage charge current from the storage capacitances 41A, 41B and of the polarization direction of the clamp capacitor 13. The DC voltage sources 23, 24 have opposite polarity relative to the clamp capacitor 13, so that depending on the position of the changeover switches 61, 62, 63 and 64, the first or the second side of the clamp capacitor 13 can be charged positively or negatively. Furthermore, each of the DC voltage sources 23, 24 is connected to a respective source switch 34, 35 of the source switching device 30, with which the DC voltage sources 23, 24 can be switched ON and OFF.

The charge storage devices 40A, 40B each have a transfer switching device 50A, 50B with a transfer switch 51A, 51B, a storage inductor 43A, 43B, a cycle switching device 70A, 70B each with a cycle switch 71A, 71B, two semiconductor valves 44A, 44B and the storage capacitances 41A ($C_c$), 41B ($C_p$). Furthermore, the storage inductor 43A of the first charge storage device 40A is connected via a semiconductor valve 45B to the storage capacitance 41B of the second charge storage device 40B, and the storage inductor 43B of the second charge storage device 40B is connected via a semiconductor valve 45A to the storage capacitance 41A of the first charge storage device 40A.

A description of the method for operating the electrostatic holding device 100 (ESC) according to FIG. 8 is given in the following with reference to its operating states and the method according to FIG. 5.

Figure 5:
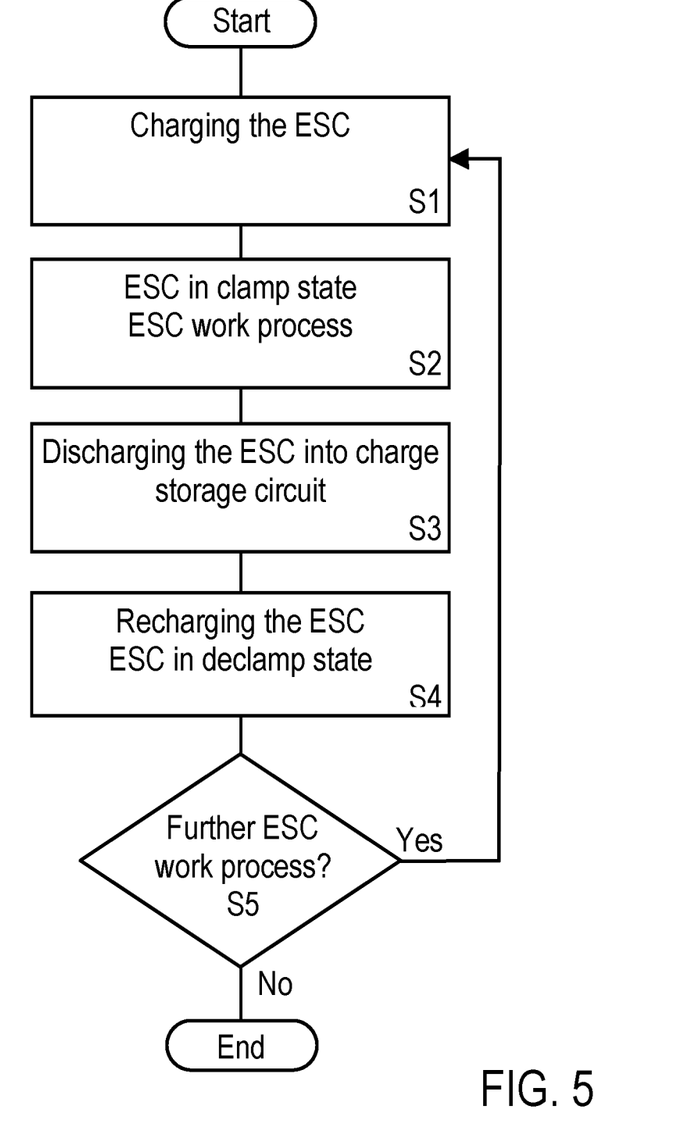
FIG. 5: a flow diagram to depict the sequence of the method according to the invention.

To charge the clamp capacitor 13, the source switches 35, 36 of the DC voltage sources 23, 24 are switched ON and the changeover switches 61, 62, 63 and 64 of the changeover switching device 60 are switched such that the desired polarization direction is achieved at the clamp capacitor 13 (step S1 in FIG. 5). The amount of the charge introduced into the clamp capacitor 13 is adjusted by controlling the charging time and the integral on the charge current into the clamp capacitor 13. At the same time, to determine the electrical energy in the clamp capacitor 13 (ESC energy), the voltage at the clamp capacitor 13 and its present capacitance value are measured. From the values determined for the charge amount and energy, the duration and cycle time for controlling the subsequent recharging to the storage capacitances 41A, 41B can be calculated.

Then the electrostatic holding device 100 is used for handling a component. The electrostatic holding device 100 is set to clamp state and an ESC work process is performed (step S2 in FIG. 5). In this state, the source switches 35, 36 of the DC voltage sources 23, 24 are switched OFF. Furthermore, the changeover switches 61, 62, 63 and 64, and the transfer switches 51A, 51B are switched OFF. The ESC work process comprises for example the holding and/or movement of the component 1 at a processing station (see FIG. 1).

Then the clamp capacitor 13 is discharged into the storage capacitances 41A, 41B of the charge transfer devices 40A, 40B (step S3 in FIG. 5). The changeover switches 61, 62, 63 and 64 and the source switches 35, 36 are opened and the transfer switches 51A, 51B are closed in order to connect the charge storage devices 40A, 40B to the clamp capacitor 13. Then the cycle switches 71A, 71B and the transfer switches 51A, 51B are activated with control cycles by the control device 80 until the charges have been transferred from the clamp capacitor 13 into the storage capacitances 41A, 41B via the storage inductors 43A, 43B in steps, using the transfer method depicted in FIGS. 6 and 7. To prevent the storage inductors 43A, 43B from becoming saturated, the current at the resistors 46A, 46B is measured as an indicator of saturation.

The control device 18 (cycle generator) is set so that only switching cycles with a duration of less than 5%, e.g. 1%, of the cycle period are generated. The short duration of the switching cycles is preferred since the storage inductors 43A, 43B only have a limited energy-absorption capacity. To prevent the storage inductors 43A, 43B from becoming magnetically saturated on absorption of energy (FIG. 7B) ("overflowing" in the vessel model), the transfer switches 51A, 51B are opened briefly and only relatively small energy packets, appropriate for the storage inductors, are transferred in several short clock cycles.

In each clock cycle, the storage capacitances 41A, 41B are charged via the semiconductor valve 44B if the clamp capacitor 13 on the positive side of the charge storage device 40B has positive charge; via the semiconductor valve 44A if the clamp capacitor 13 on the negative side of the charge storage device 40A has negative charge; via the semiconductor valve 45B if the clamp capacitor 13 on the negative side of the charge storage device 40A has a positive charge; and via the semiconductor valve 45A if the clamp capacitor 13 on the positive side of the charge storage device 40A has negative charge. Because of the symmetrical arrangement of the transfer circuits, the clamp capacitor 13 is emptied and the charge contained is transferred with high efficiency into the storage capacitances 41A, 41B in several cycles. The recovered energy can be measured by measuring the voltage at the storage capacitances 41A, 41B.

The energy measured serves as advance information for determining the duration and cycle time of the control of the changeover switches 61, 62, 63 and 64 for the next declamping of the clamp capacitor 13. To recharge the electrostatic holding device 100 (ESC in declamp state, step S4 in FIG. 5), the transfer switches 51A, 51B and the cycle switches 71A, 71B are permanently opened. The changeover switches 61, 62, 63 and 64 are set such that the clamp capacitor 13 is charged opposite to the previous polarity direction. If the preliminary information on the stored electrical energy indicates that not enough energy is present for declamping the clamp capacitor 13, in addition the source switches 35, 36 may be switched ON in order to recharge the clamp capacitor 13.

The amount of stored charge for declamping is determined by measurement of the charge time and by integration of the charge current. Furthermore, by measuring the voltage at the clamp capacitor 13 and using its present capacitance value, the electrical declamp energy introduced is determined. These values serve to determine the duration and cycle time for the subsequent further recovery of energy from the declamp state. The clamp capacitor 13 is discharged from the declamp state in the same way as it is discharged from the clamp state.

It is then checked whether a further ESC work process is desired (step S5 in FIG. 5). Accordingly, the method is continued with a further charging of the electrostatic holding device 100 (step S1 in FIG. 5) or terminated.

In the concrete application, the capacitance values $C_{41A}$, $C_{41B}$ of the storage capacitances 41A, 41B and the inductance values $L_{43A}$, $L_{43B}$ of the storage inductors 43A, 43B are e.g. selected as follows: $C_{41A} = C_{41B} = \frac{1}{2} C_{13} = 3$ nF; and $L_{43A} = L_{43B} = 1$ mH.

The features of the invention disclosed in the description above, the drawings and the claims may be relevant, both individually and in combination or in sub-combination, to the implementation of the invention in its various embodiments.

What is claimed is:

1. An electrostatic holding device which is configured for holding a component by electrostatic holding forces, comprising:
   a clamp carrier having an electrode device and being configured to receive the component,
   a voltage source device being configured for providing a source charge current for charging the clamp carrier, and
   a source switching device being arranged for a switchable connection of the voltage source device with the electrode device, wherein
   at least one charge storage device which has a storage capacitor and is configured to receive a clamp discharge current and temporarily store electrical charges from the clamp carrier in the storage capacitor and provide a storage charge current for charging the clamp carrier.

2. The electrostatic holding device according to claim 1, wherein:
each charge storage device comprises a transfer switching device for a switchable connection of the electrode device to the storage capacitor, such that the clamp discharge current can flow from the electrode device to the storage capacitor, and
a changeover switching device is provided for switchable connection of the storage capacitor to the electrode device, such that the storage charge current can flow from the storage capacitor to the electrode device with settable current direction.

3. The electrostatic holding device according to claim 2, wherein the changeover switching device is furthermore arranged for switchable connection of the voltage source device to the electrode device, such that the source charge current can flow from the voltage source device to the electrode device with settable current direction.

4. The electrostatic holding device according to claim 2, wherein the electrode device is connected to the storage capacitor directly via the transfer switching device and the changeover switching device.

5. The electrostatic holding device according to claim 4, wherein the storage capacitor has a total capacitance which is equal to 3 times a capacitance value of the clamp carrier.

6. The electrostatic holding device according to claim 4, wherein the storage capacitor comprises one single storage condenser.

7. The electrostatic holding device according to claim 1, wherein:
two charge storage devices are provided, each with a transfer switching device and a storage capacitor,
the charge storage devices each contain a transfer circuit with a storage inductor and a cycle switching device,
the electrode device is connected to one of the storage capacitors via a respective one of the transfer switching device and the transfer circuits, so that the clamp discharge current can flow to the storage capacitors via the transfer circuits, and
the cycle switching devices are arranged for charging each of the storage inductors from the electrode device and discharging each of the storage inductors into the storage capacitors.

8. The electrostatic holding device according to claim 1, wherein the clamp carrier is fixedly connected with at least one of the voltage source device and the source switching device and the at least one charge storage device and the transfer and changeover switching devices and is movable therewith.

9. A method for operating an electrostatic holding device with a clamp carrier which is configured to hold a component by electrostatic holding forces, comprising the steps:
charging of the clamp carrier with a first polarization direction,
receiving the component on the clamp carrier,
holding and/or moving the component with the clamp carrier,
discharging the clamp carrier with at least one charge storage device, and
charging the clamp carrier with a second opposite polarization direction, wherein charges flow from the at least one charge storage device to the clamp carrier and the component is released from the electrostatic holding device.

10. The method according to claim 9, wherein the discharging of the clamp carrier comprises a reloading of charges of the clamp carrier via a pre-resistor into a storage capacitor of the charge storage device.

11. The method according to claim 10, wherein the storage capacitor of the charge storage device has a total capacitance which is equal to 3 times a capacitance value of the clamp carrier.

12. The method according to claim 9, wherein the discharging of the clamp carrier comprises a step-wise reloading of charges of the clamp carrier into a storage inductor of a transfer circuit, and from the storage inductor into a storage capacitor of the charge storage device.

13. A method for operating an electrostatic holding device according to claim 1, said method comprising:
charging of the clamp carrier with a first polarization direction,
receiving the component on the clamp carrier,
holding and/or moving the component with the clamp carrier,
discharging the clamp carrier with at least one charge storage device, and
charging the clamp carrier with a second opposite polarization direction, wherein charges flow from the at least one charge storage device to the clamp carrier and the component is released from the electrostatic holding device.

14. A transfer circuit which is configured for transmitting charges from a working capacitance to a storage capacitance, comprising a transfer switch, a storage inductor, a cycle switch, a semiconductor valve and a cycle control circuit, wherein:
the working capacitance, the transfer switch, the storage inductor, the semiconductor valve and the storage capacitance are connected in series,
the cycle switch is connected in parallel to the semiconductor valve and the storage capacitance, and
the cycle control circuit is arranged for switching the cycle switch such that in a first switch phase, charges are transferred from the working capacitance to the storage inductor, and in a second switch phase, charges are transferred from the storage inductor to the storage capacitance.

15. The transfer circuit according to claim 14, wherein:
the transfer switch and the cycle switch comprise transistors, and
the semiconductor valve comprises a semiconductor diode.

* * * * *